United States Patent [19]

Van Vaals

[11] Patent Number: 4,972,147
[45] Date of Patent: Nov. 20, 1990

[54] MAGNETIC RESONANCE METHOD FOR OBTAINING SELECTED SPECTRA

[75] Inventor: Johannes J. Van Vaals, Eindhoven, Netherlands

[73] Assignee: U.S. Philips Corporation, New York, N.Y.

[21] Appl. No.: 361,465

[22] Filed: Jun. 5, 1989

[30] Foreign Application Priority Data

Mar. 2, 1989 [NL] Netherlands ............ 8900506

[51] Int. Cl.$^5$ ............................ G01R 33/20
[52] U.S. Cl. ......................... 324/307; 324/309
[58] Field of Search ............ 324/307, 311, 312, 309

[56] References Cited

U.S. PATENT DOCUMENTS

| | | | |
|---|---|---|---|
| 4,510,449 | 4/1985 | Ernst et al. | 324/311 |
| 4,680,546 | 7/1987 | Dumoulin | 324/307 |
| 4,789,832 | 12/1988 | Nagayama | 324/307 |

OTHER PUBLICATIONS

A. Bax et al., "Separation of the Different Orders of NMR Multiple-Quantum Transitions by the Use of Pulsed Field Gradients", Chemical Physics Letters, vol. 69, No. 3, Feb. 1, 1980, pp. 567–570.
C. H. Sotak, "A Volume-Localized,, Two-Dimensional NMR Method for the Determination of Lactate Using Zero-Quantum Coherence Created in a Stimulated Echo Pulse Sequence", Magnetic Resonance in Medicine, vol. 7, No. 3, Jul. 1988, 364–370.

Primary Examiner—Michael J. Tokar
Assistant Examiner—Kevin D. O'Shea
Attorney, Agent, or Firm—Jack D. Slobod

[57] ABSTRACT

The method includes a critical time shift of a refocusing pulse between two (90°) excitation pulses which produce multiple quantum coherence signals and which are followed by a (90°) read pulse (using a critical timing a refocusing pulse serving the same purpose can also be applied between the second excitation pulse and the read pulse). With respect to the center of the time path between the excitation pulses or between the excitation pulse and the read pulse the time shift is chosen to be such that give resonances do not occur positively or negatively in the spectrum whereas other resonances do occur therein (i.e. at substantially maximum strength). The MRI method can be combined with the use of spatially selective gradients in order to obtain localized spectra or images.

20 Claims, 2 Drawing Sheets

MAGNETIC RESONANCE METHOD FOR OBTAINING SELECTED SPECTRA

BACKGROUND OF THE INVENTION

1. Field of the Invention

The invention relates to a method of determining a nuclear magnetisation distribution in a part of an object where, using a sequence of at least three rf pulses in combination with different gradient magnetic fields or not, a resonance signal is generated and sampled in order to obtain a local or non-local spectrum of matter in which weakcoupled nuclear spins occur.

1. Description of the Prior Art

In a publication in Chemical Physics Letters, Vol. 69, No. 3, Feb. 1, 1980, pp. 567-570; entitled "Separation of the different orders of NMR-multiple quantum transitions by use of pulse field gradients" A. Bax discloses a pulse sequence whereby multiple quantum coherences are measured in a system of two weakcoupled spins. The described pulse sequence comprises three 90° pulses where, subsequent to a first 90° pulse a second 90° pulse is generated after a waiting period $\tau$, and a third 90° pulse is generated after a waiting period Tm, acquisition taking place approximately a period of time $\tau$ after the third 90° pulse. The waiting period $\tau$ between the first two pulses is generally chosen to be equal to $1/(2J)$ but may deviate from $1/(2J)$, where J is the coupling constant between the two coupled spins. The effect thus obtained consists in that a maximum amplitude is reached of the zero and two quantum coherences which evolve during the period Tm between the second and the third 90° pulse. For the zero-quantum coherence the evolution takes place at an angular frequency which corresponds to the difference between the chemical shifts of the coupled spins, while the evolution for the two-quantum coherence takes place at an angular frequency which corresponds to the sum of the chemical shifts. The third 90° pulse will make these coherences observable in the form of a one quantum coherence signal which will be maximum after a period of time $\tau$ subsequent to this third pulse. When use is made of the described pulse sequence, however, the amplitude of this multiple quantum coherence signal will also be dependent on the chemical shifts, i.e. due to the choice of the waiting period $\tau$ between the first two 90° pulses. This dependency on chemical shift can be eliminated in practice by generating a 180° pulse at the instant $\tau/2$ during the waiting period elapsing between the first and the second rf pulse. The described pulse frequency sequence enables measurement of multiple quantum coherences, but not of discrimination between the zero and two quantum coherences.

SUMMARY OF THE INVENTION

It is the object of the invention to provide a method of determining (localised and selected) spectra by means of multiple quantum filters where multiple quantum coherences of different substances in an object to be examined can be separately imaged.

To achieve this, a method in accordance with the invention is characterized in that either after the first or after the second rf pulse of said three rf pulses a 180° rf pulse is generated at an instant which precedes or lags a halfway instant which is situated halfway between the first and the second or between the second and the third rf pulse, said instant being chosen so that the amplitude of the multiple quantum coherences is zero for some substances present and is at least substantially maximum for other substances present. If the 180° pulse is applied after the first 90° pulse, the amplitude of, for example the two quantum coherence will vary as $\cos(\pi S \cdot T)$, where S is the frequency difference between the coupled resonances of a given substance which will generally have different values for the various substances, and T is double the period of time between the 180° pulse and the instant $\tau/2$.

A preferred version of a method in accordance with the invention is characterized in that, after a first waiting period $\tau$ between the first and the second rf pulse, a second 180° pulse is generated halfway the second waiting period Tm. The use of this second 180° pulse offers the advantage that the effects of magnetic field inhomogeneities are suppressed. Evidently, gradient magnetic fields can be applied during the various excitation pulses and 180° pulses for example for spatial localisation where the desired multiple quantum coherences are measured, or for avoiding effects of spin resonances outside the selected spatial localisation.

BRIEF DESCRIPTION OF THE DRAWING

The invention will be described in detail hereinafter with reference to a drawings; therein.

DETAILED DESCRIPTION OF THE PREFERRED EMBODIMENTS

Figure 1:
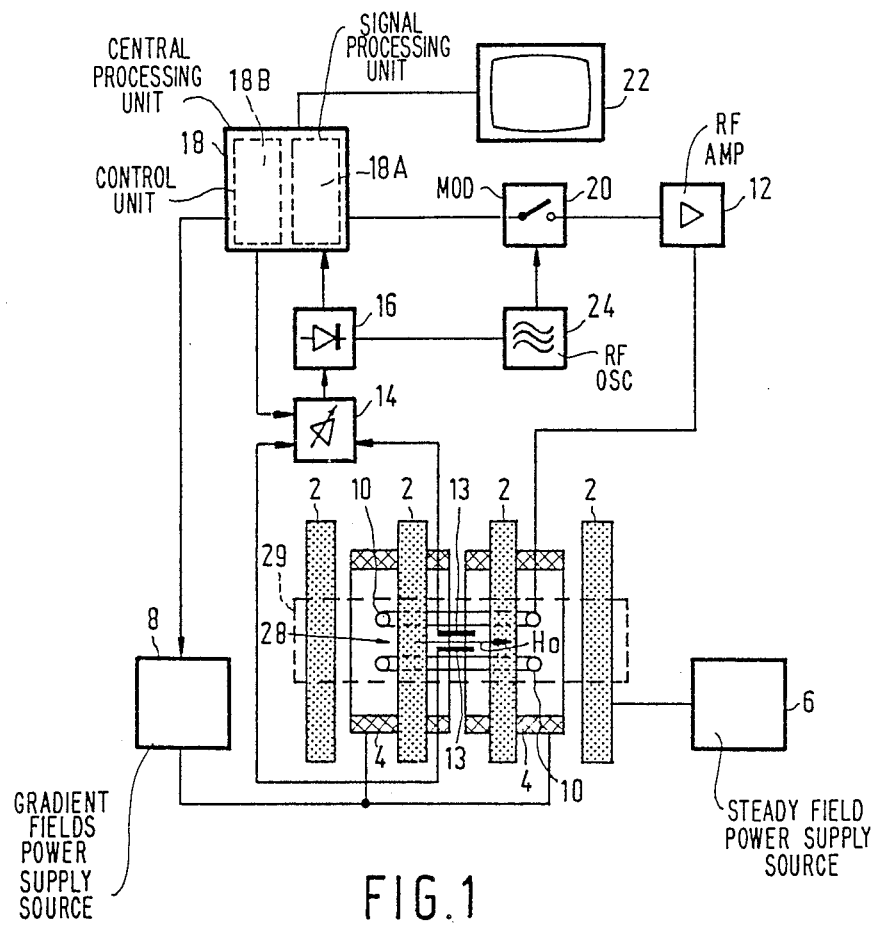
FIG. 1 shows a device in accordance with the invention.

FIG. 1 shows a magnetic resonance apparatus, comprising a magnet system 2 for generating a steady magnetic field, a magnet system 4 for generating a gradient magnetic field and power supply sources 6 and 8 for the magnet system 2 and the magnet system 4, respectively. An rf magnet coil 10 serves for generating an rf magnetic alternating field; to this end it is connected to the output of an rf amplifier 12. For detection of the resonance signal generated by the rf transmitted field in an object to be examined use is made of an rf coil 13 which is connected to a signal amplifier 14 for this purpose, the output of said amplifier being connected to a detector 16. The output of the detector 16 is connected to a central processing unit 18. The central processing unit 18 also controls a modulator 20 for the rf source 12, the power supply source 8 for the gradient magnet coils, and a monitor 22 for image display. An rf oscillator 24 powers the modulator 20 as well as the detector 16. The transmitter coil 12 arranged within the magnet systems 2 and 4 encloses a measuring space 28 in which an object to be examined can be arranged. In the measuring space 28 a steady magnetic field, gradient magnetic fields for object slice selection and a spatially uniform magnetic alternating field can be generated. The measuring space 28, the transmitter coil 12 and the receiver coil 13 are enclosed by an rf signal shielding cage 29 which serves to shield the environment from the rf signals occurring in the measuring space 28. The central processing device 18 comprises a signal processing unit 18a and a control unit 18b. The signal processing unit 18a receives the signals received by the receiver coil and processes these signals so as to form, for example two-dimensional images (2D density distributions, spectra) which can be displayed on the monitor 22. The control unit 18b comprises programmable control means which control the modulator 20 as well as the magnet power supply source 8, so that the device shown in FIG. 1 is capable of performing measuring sequences consisting of cycles of rf pulse sequences during which gradient magnetic fields may or may not be applied. Nuclear spins can thus be excited in an object or a part of the object, the position of the excited nuclear spin being dependent on the frequency and the strength of the applied rf pulse and the applied gradient magnetic fields in combination with the steady magnetic field present.

Figure 2:
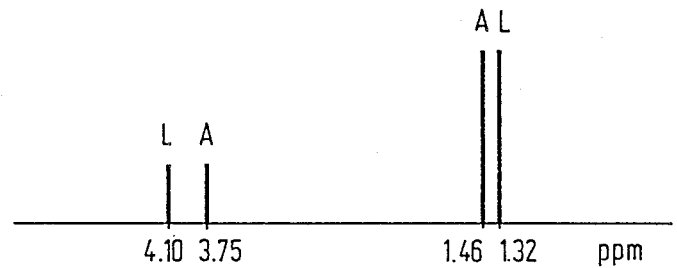
FIG. 2 shows a proton spectrum of lactate and alanine.

FIG. 2 shows spectral positions of lactate and alanine. As is known, the precessional frequency of the nuclear magnetisation M is determined by $\Omega = \gamma \cdot B$. The gyromagnetic ratio $\gamma$ depends only on the type of nucleus for as long as this nucleus can be considered to be free. Usually the nuclei or protons are not to be considered to be free because they are influenced by binding electrons present in the vicinity. This becomes apparent inter alia as so-called chemical shift $\sigma$. A spin-spin coupled bound proton does not resonate at $\Omega = \gamma \cdot B$, but at $\Omega' = \gamma \cdot B(1 - \sigma) - J \cdot M_I$. Therein, J is the coupling constant and $M_I$ is the magnetic moment ($+\frac{1}{2}$ or $-\frac{1}{2}$). Generally, $\sigma$ is very small (order of magnitude $10^{-6}$). In FIG. 2 the proton spectrum of lactate and alanine is plotted along the horizontal axis in ppm. For a magnetic field strength B amounting to 6.3 T, the frequency difference S between the resonance frequencies of the protons of the $CH$-group and $CH_3$-group for lactate is Sl=750 Hz and for alanine it is Sa=618 Hz.

Figure 3:
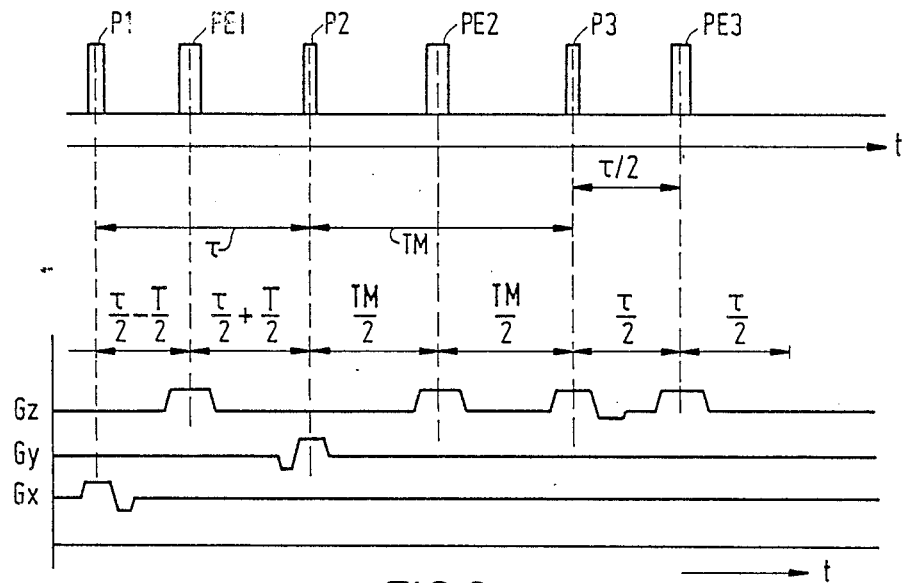
FIG. 3 shows a pulse time diagram of a pulse sequence for generating localised and selected spectra.

FIG. 3 shows a pulse sequence for a magnetic resonance excitation method for obtaining localised and selected proton spectra by means of multiple quantum filters. The basic pulse sequence whereby multiple quantum coherences are measured in a system of two weakly coupled spins consists of three 90° pulses. These pulses are denoted by the references p1, p2 and p3 in FIG. 3, the period of time elapsing between the first two 90° pulses amounting to $\tau$, whilst a period of time elapsing between the second and the third 90° pulse amounts to Tm. The period of time $\tau$ between the first two 90° pulses is generally chosen to be equal to 1/(2J), where J is the coupling constant. This leads to a maximum amplitude of the zero and two quantum coherences ZQC and 2QC which evolve during the period Tm between the second and the third 90° pulse. The pulse sequence consisting of three 90° pulses p1, p2 and p3 and the intermediate waiting periods $\tau$ and Tm is known per se from the cited publication Chemical Physical Letters, Vol. 69, No. 3, Feb. 1, 1980. For the zero quantum coherence said evolution takes place at an angular frequency which corresponds to the difference between the chemical shifts of the coupled spins, whilst for the two-quantum coherence it takes place in proportion to the sum of the chemical shifts. The third 90° pulse p3 will make these coherences observable in the form of a one-quantum coherence which will be maximum a period of time $\tau$ after this pulse p3.

Moreover, the amplitude of the multiple quantum coherences in the above pulse sequence will be dependent on the chemical shifts due to the selection of the period $\tau$ between the first and the second 90° pulse p1 and p2 (for zero quantum coherence, this dependency amounts to $\sin\pi \cdot S\tau$, and for the two quantum coherence it is $\cos\pi \cdot S\tau$, where S is the frequency difference between the coupled spins in Hz). The effect of this chemical shift can be eliminated by introducing a 180° pulse at the instant $\tau/2$ between the first 90° pulse p1 and the second 90° pulse p2. In the method in accordance with the invention, a 180° pulse is added to the known pulse sequence, consisting of three 90° pulses, at the instant which is situated at a value T/2 just before or just after the instant $\tau/2$ halfway between said two 90° pulses p1 and p2. The value T is chosen so that the amplitude of the multiple quantum coherence is zero for some substances present and is substantially maximum for other substances present, it being possible to combine this procedure with spatially localised gradient magnetic fields during the various rf pulses as described in German Patent Appplication No. P 36 05 547 in the name of Applicant. The amplitude of, for example the two quantum coherence will then vary according to the function $\cos\pi \cdot ST$, where S will generally have different values for the various substances. In the pulse sequence in accordance with the invention, a second 180° pulse pe2 is (however, not necessarily) inserted between the second and the third 90° pulse p2 and p3 and also at the instant $\tau/2$ after the third 90° pulse p3. The latter 180° pulse is denoted by the reference pe3 in FIG. 3. As a result of the addition of these two 180° pulses pe2 and pe3 the effects of magnetic field inhomogeneities are suppressed. For the sake of clarity the gradient fields Gz, Gy and Gx are shown as a function of the time in FIG. 3, by way of example, with the associated rf pulses p1 to p3 and pe1 to pe3. Therein, each rf pulse is, in effect, slice-selective in the direction of the gradient of the simultaneously occurring gradient magnetic field. It should be apparent that since the three rf pulses p1 to p3 are slice-selective in three mutually orthogonal respective directions a sub-volume is selected by the combination of said three rf pulses. The rf pulses pe1 to pe3 are shown as slice-selective in the same direction as rf pulse pe3. The spatial localisation, of course, can also be realised by means of gradient magnetic fields applied in a manner other than described above.

Figure 4:
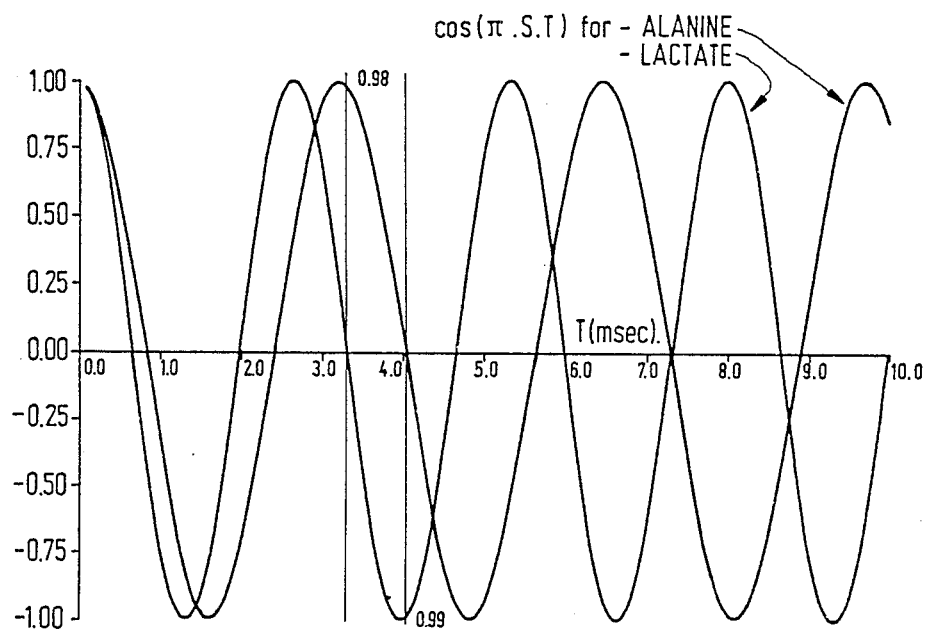
FIG. 4 shows an amplitude time diagram in which maxima and minima of the spectra of lactate and alanine are shown.

FIG. 4 shows the amplitude variation for the two quantum coherence for alanine and lactate as a function of time T. The two quantum coherence varies as a function of $\cos\pi \cdot ST$, which is shown in FIG. 4 for the values Sa=618 Hz for alanine and Sl=750 Hz for lactate. It appears from the Figure that at the instant T=3.3 milliseconds the respective values for alanine and lactate amount to $\cos\pi Sa\, T = 0.98$ and $\cos\pi Sl\, T = 0$. For this time setting therefore, no signal is to be expected from lactate whereas a substantially maximum signal is to be expected from alanine. For a time setting T=4.0 milliseconds, the signal for alanine will be minimum and that for lactate will be maximum. These values hold for measurements performed using a static magnetic field having a strength of 6.3 T.

By using additional dephasing gradient magnetic fields (for example, for two quantum coherence a gradient which is twice as large after the third 90° pulse p3 as before that) and by also using phase cycling of the rf pulses (for example x, y over the first and the third pulse) undesirable excitations can be additionally suppressed. The described method is essentially a method of distinguishing, for example alanine from lactate within a single measurement (from a single resonance signal generated), without addition or subtraction of different sub-measurements. In a spectrum for which the described steps have not been taken, the resonances of the two substances will usually overlap, certainly in the case of in vivo situations.

The described pulse sequences can be extended to methods with spatially selective multi-dimensional measurements. Several measurements can be combined with different periods T and/or Tm so that high resolution two dimensional spectroscopic MRI is possible. Moreover, the 180° pulse pe2, if any, inserted between the second and the third 90° pulse p2 and p3 can be slightly shifted in time with respect to Tm/2, so that the 180° pulses pe1 and pe3 can be omitted if the steady magnetic field in measuring space 28 is sufficiently homogeneous, for example in the case of small objects. Furthermore, the described sequences can in principle be combined with a preparation gradient and a read gradient for making a location-selective multiple quantum coherence image.

The pulse and gradient magnetic field sequence shown in FIG. 3 may be preceded by a frequency-selective 90° pulse possibly succeeded by a gradient magnetic field for exciting and subsequently dephasing the protons which cause the strong "water peak" in the spectrum, so that this peak in the spectrum is suppressed.

I claim:

1. A method of determining a nuclear magnetization distribution of one of predetermined first and second substances in an object, which first and second substances have substantially overlapping nuclear magnetic distribution spectra comprising irradiating the object with a sequence of three rf pulses and a 180 degree rf pulse between two consecutive ones of said three rf pulses, said three rf pulses being selected and positioned in time to excite weakly coupled nuclear spins in said first substance and in said second substance, and said 180 degree rf pulse being at an instant shifted in time from an instant halfway between said two consecutive ones of said three rf pulses, the instant of said 180 rf pulse being chosen so that the amplitude of a multiple quantum coherence is zero for the first substance and is substantially maximum for the second substance; and sampling a nuclear magnetic resonance signal generated after said sequence.

2. A method as claimed in claim 1, wherein said 180 degree rf pulse is a first 180 degree rf pulse and is between a first and a second of said three rf pulses and wherein said sequence further comprises a second 180 degree rf pulse halfway between said second and a third of said three rf pulses.

3. A method as claimed in claim 1, wherein said 180 degree rf pulse is a first 180 degree rf pulse and is between a second and a third of said three rf pulses and wherein said sequence further comprises a second 180 degree rf pulse halfway between a first and a second of said three rf pulses.

4. A method as claimed in claim 1, wherein said sequence further comprises a slice-selective 180 degree rf echo pulse after the expiration of a waiting period after a third of said three rf pulses, said waiting period being equal to half a waiting period between a first and a second of said three rf pulses.

5. A method as claimed in claim 2, wherein said sequence further comprises a slice-selective 180 degree rf echo pulse after the expiration of a waiting period after the third of said three rf pulses, said waiting period being equal to half a waiting period between the first and the second of said three rf pulses.

6. A method as claimed in claim 3, wherein said sequence further comprises a slice-selective 180 degree rf echo pulse after the expiration of a waiting period after the third of said three rf pulses, said waiting period being equal to half a waiting period between the first and the second of said three rf pulses.

7. A method as claimed in claim 1, wherein said 180 degree rf pulse is slice-selective.

8. A method as claimed in claim 2, wherein said first and second 180 degree rf pulses are slice-selective for the same slice.

9. A method as claimed in claim 3, wherein said first and second 180 degree rf pulses are slice-selective for the same slice.

10. A method as claimed in claim 4, wherein said 180 degree rf pulse is slice-selective for the same slice as said slice-selective 180 degree rf echo pulse.

11. A method as claimed in claim 5, wherein said first and second 180 degree rf pulses are slice-selective for the same slice as said slice-selective 180 degree rf echo pulse.

12. A method as claimed in claim 6, wherein said first and second 180 degree rf pulses are slice-selective for the same slice as said slice-selective 180 degree rf echo pulse.

13. A method as claimed in claim 1, wherein said three rf pulses are respectively slice-selective in three orthogonal directions for the selection of a sub-volume in the object.

14. A method as claimed in claim 2, wherein said three rf pulses are respectively slice-selective in three orthogonal directions for the selection of a sub-volume in the object.

15. A method as claimed in claim 3, wherein said three rf pulses are respectively slice-selective in three orthogonal directions for the selection of a sub-volume in the object.

16. A method as claimed in claim 4, wherein said three rf pulses are respectively slice-selective in three orthogonal directions for the selection of a sub-volume in the object.

17. A method as claimed in claim 5, wherein said three rf pulses are respectively slice-selective in three orthogonal directions for the selection of a sub-volume in the object.

18. A method as claimed in claim 6, wherein said three rf pulses are respectively slice-selective in three orthogonal directions for the selection of a sub-volume in the object.

19. A method as claimed in claim 7, wherein said three rf pulses are respectively slice-selective in three orthogonal directions for the selection of a sub-volume in the object.

20. A method as claimed in claim 1, wherein said 180 degree rf pulse is between a first and a second of said three rf pulses.

* * * * *